(12) United States Patent
Liu et al.

(10) Patent No.: US 12,464,714 B2
(45) Date of Patent: *Nov. 4, 2025

(54) SEMICONDUCTOR DEVICE HAVING NON-CONTINUOUS WALL STRUCTURE SURROUNDING A STACKED GATE STRUCTURE INCLUDING A CONDUCTIVE LAYER DISPOSED BETWEEN SEGMENTED PORTIONS OF THE WALL STRUCTURE

(71) Applicant: Taiwan Semiconductor Manufacturing Company, Ltd., Hsinchu (TW)

(72) Inventors: Chien-Hsuan Liu, Tainan (TW); Chiang-Ming Chuang, Changhua (TW); Chih-Ming Lee, Tainan (TW); Kun-Tsang Chuang, Miaoli County (TW); Hung-Che Liao, Tainan (TW); Chia-Ming Pan, Tainan (TW); Hsin-Chi Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/429,264

(22) Filed: Jan. 31, 2024

(65) Prior Publication Data
US 2024/0172434 A1    May 23, 2024

Related U.S. Application Data

(63) Continuation of application No. 16/740,499, filed on Jan. 13, 2020, now Pat. No. 11,925,017, which is a
(Continued)

(51) Int. Cl.
*H10D 30/68* (2025.01)
*H01L 21/3213* (2006.01)
(Continued)

(52) U.S. Cl.
CPC ....... *H10B 41/30* (2023.02); *H01L 21/32135* (2013.01); *H10B 41/10* (2023.02);
(Continued)

(58) Field of Classification Search
CPC ..... H01L 29/423; H01L 29/788; H10B 41/10; H10B 41/30; H10B 41/42; H10B 41/47; H10D 30/6892
See application file for complete search history.

(56) References Cited

U.S. PATENT DOCUMENTS

| | | | | |
|---|---|---|---|---|
| 2004/0041202 A1* | 3/2004 | Kim | ...... | H10B 41/40 257/E27.081 |
| 2007/0241386 A1* | 10/2007 | Wang | ...... | H10B 41/40 257/314 |

(Continued)

*Primary Examiner* — Anh D Mai
(74) *Attorney, Agent, or Firm* — JCIPRNET

(57) ABSTRACT

A semiconductor device includes a stacked gate structure, a plurality of stacks and a first conductive layer. The stacks are disposed aside the stacked gate structure and arranged along both a first direction and a second direction perpendicular to the first direction, wherein the stacks are extended continuously along the first direction and segmented in the second direction. The first conductive layer is disposed between segmented portions of the stacks along the second direction, wherein top surfaces of the segmented portions of the stacks are higher than a top surface of the first conductive layer.

20 Claims, 12 Drawing Sheets

Related U.S. Application Data continuation of application No. 15/054,100, filed on Feb. 25, 2016, now Pat. No. 10,535,670.

(51) Int. Cl.
  *H10B 41/10* (2023.01)
  *H10B 41/30* (2023.01)
  *H10B 41/42* (2023.01)
  *H10B 41/47* (2023.01)
  *H10D 30/01* (2025.01)
  *H10D 64/01* (2025.01)

(52) U.S. Cl.
  CPC ............. *H10B 41/42* (2023.02); *H10B 41/47* (2023.02); *H10D 30/0411* (2025.01); *H10D 30/683* (2025.01); *H10D 30/6892* (2025.01); *H10D 64/035* (2025.01)

(56) References Cited

U.S. PATENT DOCUMENTS

| | | | |
|---|---|---|---|
| 2015/0084111 A1* | 3/2015 | Wu | H01L 29/40114 |
| | | | 257/316 |
| 2018/0047740 A1* | 2/2018 | Lee | H10B 41/50 |
| 2019/0148513 A1* | 5/2019 | Lin | H01L 21/76294 |
| | | | 257/296 |
| 2019/0259771 A1* | 8/2019 | Chuang | H10B 43/50 |

* cited by examiner

SEMICONDUCTOR DEVICE HAVING NON-CONTINUOUS WALL STRUCTURE SURROUNDING A STACKED GATE STRUCTURE INCLUDING A CONDUCTIVE LAYER DISPOSED BETWEEN SEGMENTED PORTIONS OF THE WALL STRUCTURE

CROSS-REFERENCE TO RELATED APPLICATION

This application is a continuation application of and claims the priority benefit of a prior application Ser. No. 16/740,499, filed on Jan. 13, 2020, now allowed, which is a continuation application of and claims the priority benefit of a prior application Ser. No. 15/054,100, filed on Feb. 25, 2016, now patented. The entirety of the above-mentioned patent application is hereby incorporated by reference herein and made a part of this specification.

BACKGROUND

Non-volatile memory is a kind of memory having the advantages that it allows multiple data storing, reading or erasing operations. The data stored in the non-volatile memory will be retained even if the power applied to the device is cut off. The non-volatile memory has become a widely adopted memory device in personal computers and electronic equipment.

Along with the rapid progress of science and technologies, the level of integration of semiconductor devices increases, and therefore dimensions of various memory devices need to be further reduced. In the event of reducing the dimensions of the memory devices, it is desirable to increase the reliability of memory cells, so as to further enhance the device performance and lower the production cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
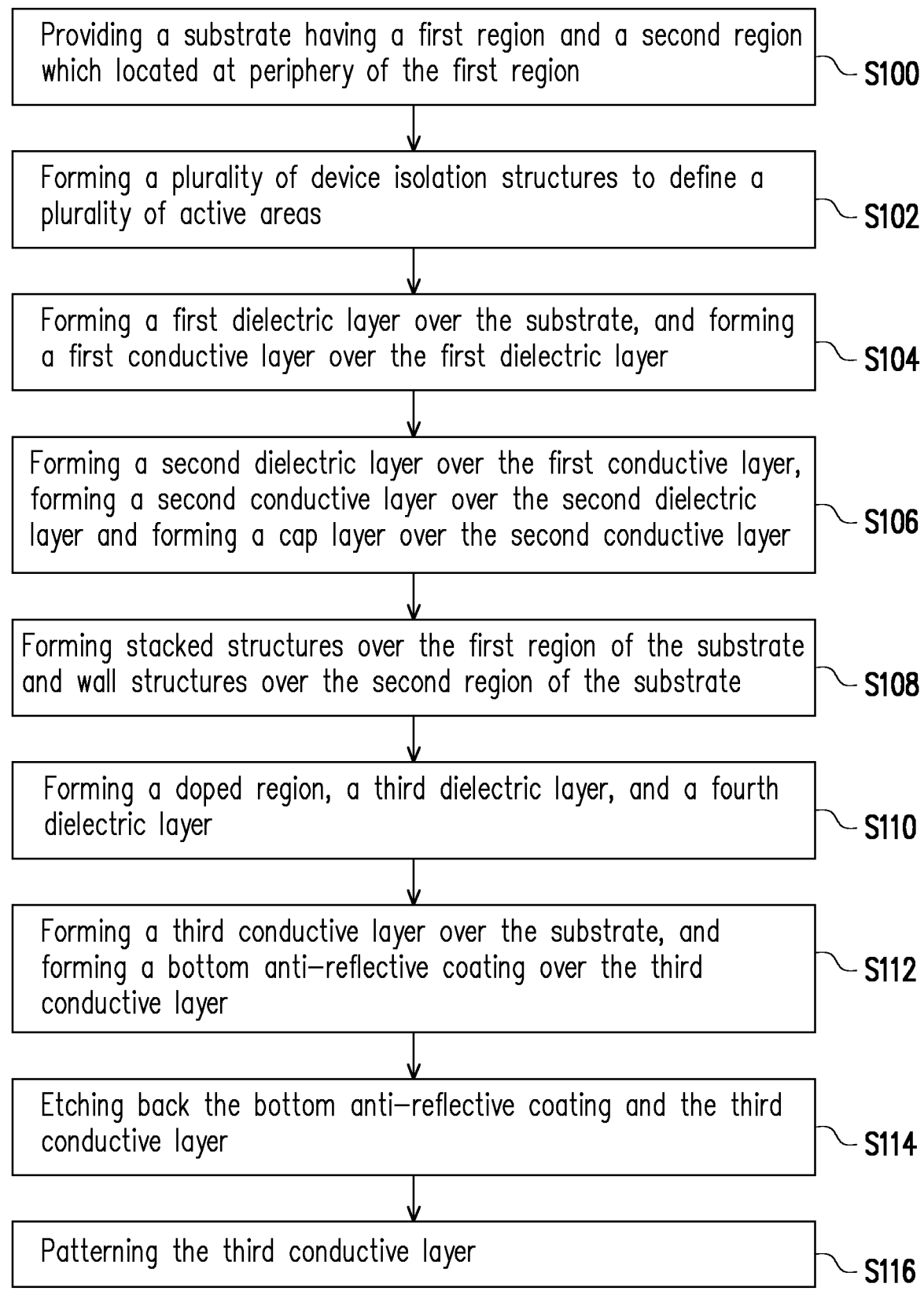
FIG. 1 is an exemplary flow chart showing the process steps of the manufacturing method of the non-volatile memory in accordance with some embodiments of the present disclosure.

The following disclosure provides many different embodiments or examples for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. The repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary manufacturing processes of a non-volatile memory and the non-volatile memory fabricated therefrom. The non-volatile memory may be formed on bulk silicon substrates in certain embodiments of the present disclosure. Still, the non-volatile memory may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes and the like. The embodiments are not used to limit the contexts.

Figure 2:
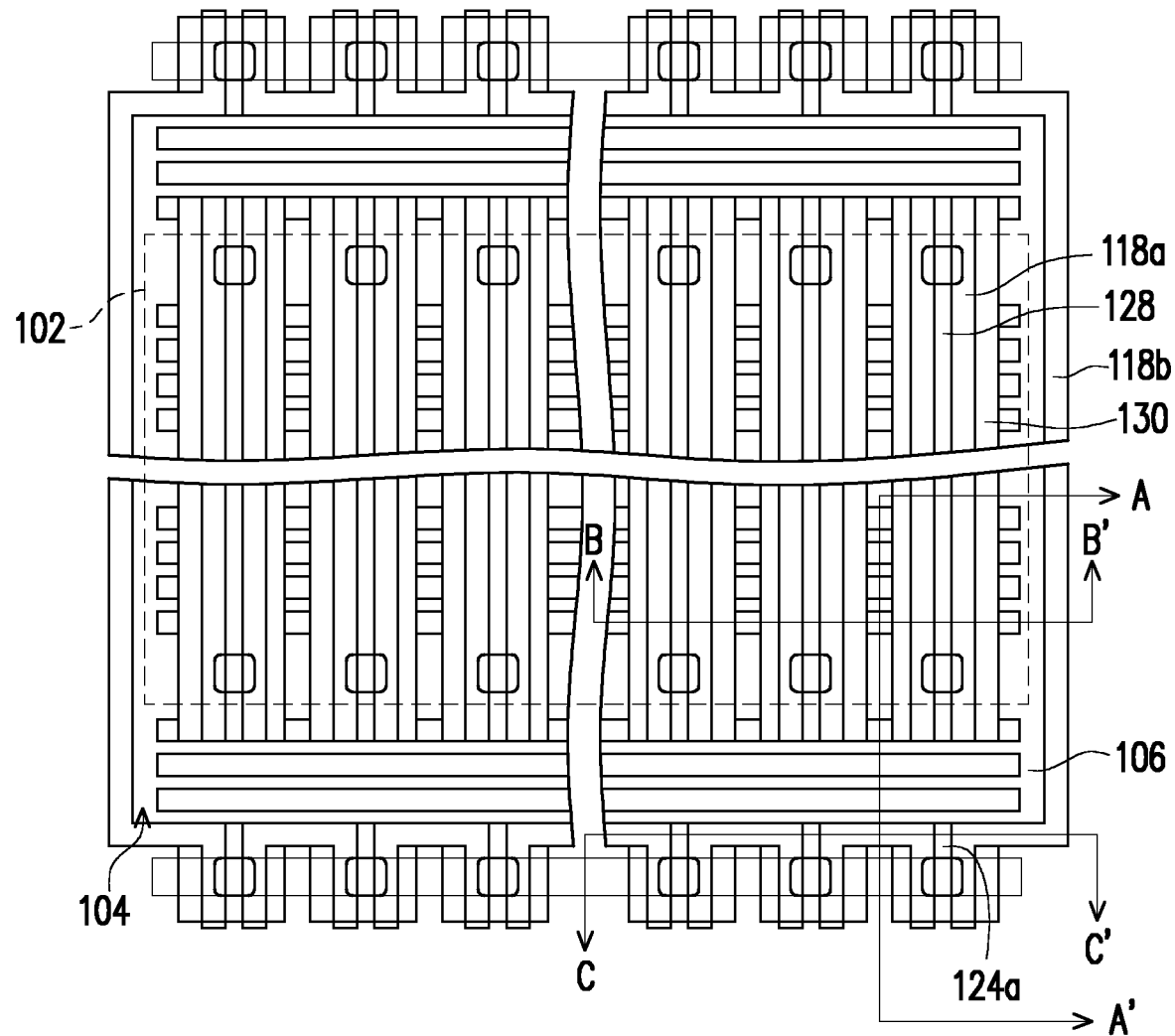
FIG. 2 is a top view showing the non-volatile memory according to some embodiments of the present disclosure.
Figure 3A:
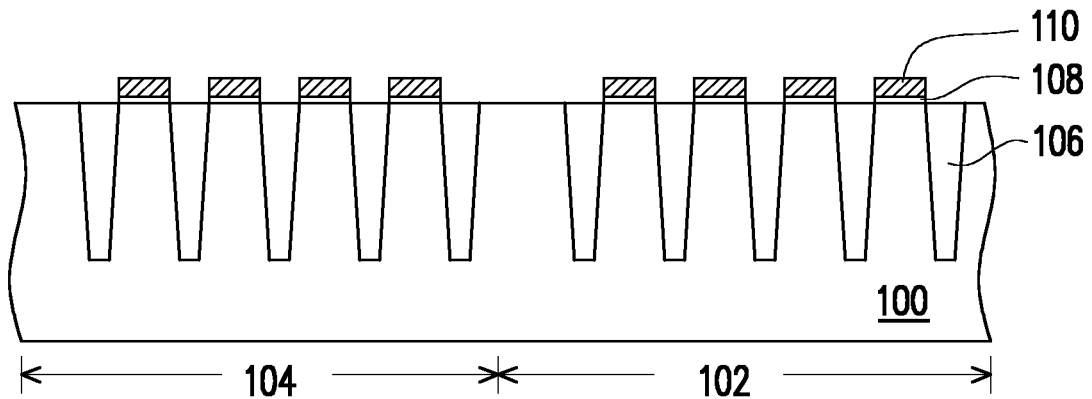
FIGS. 3A-3E are cross-sectional views showing the non-volatile memory taken along the line A-A' of FIG. 2 at various stages of the manufacturing method according to some embodiments of the present disclosure.
Figure 3B:
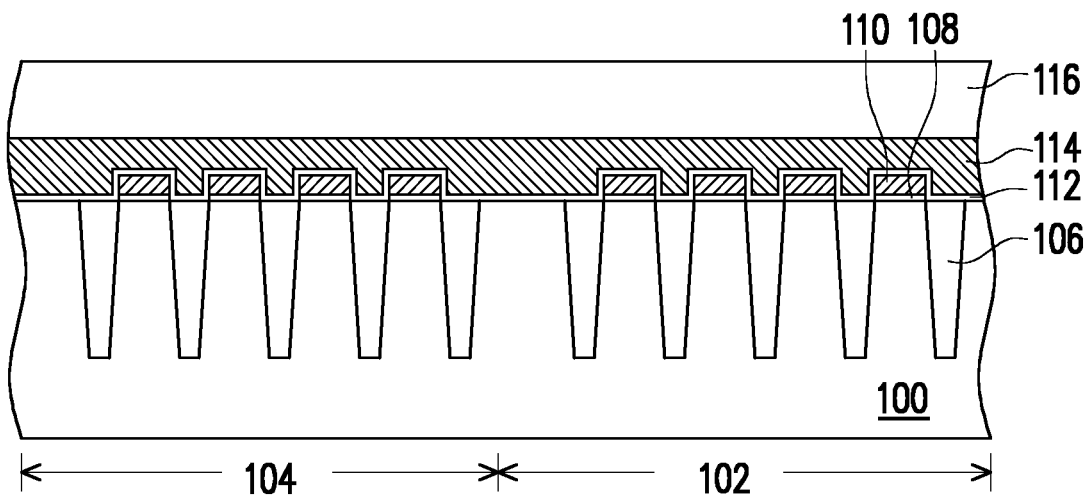
Figure 3C:
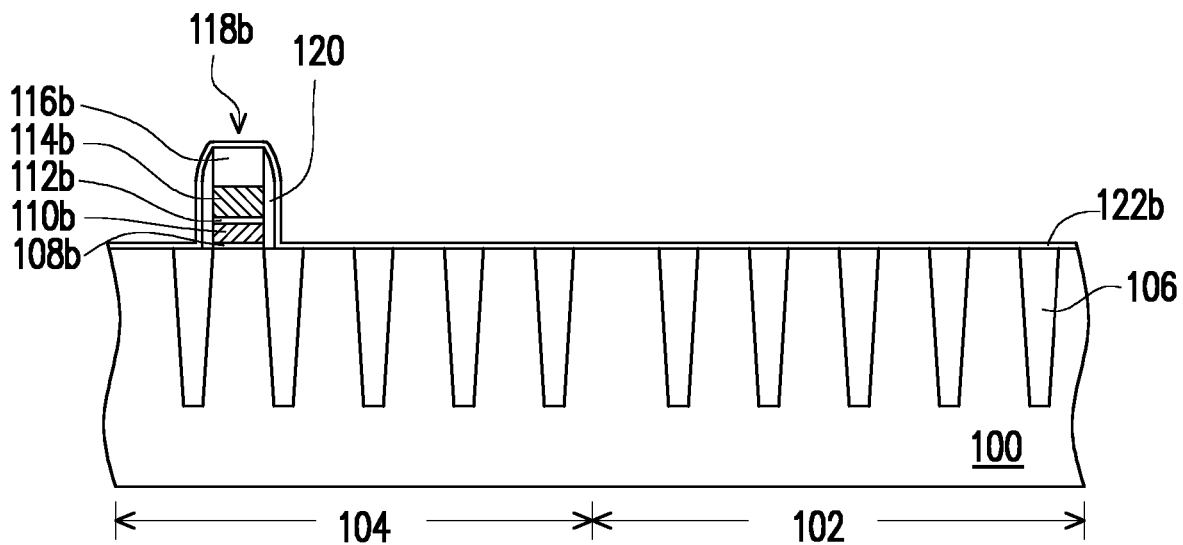
Figure 3D:
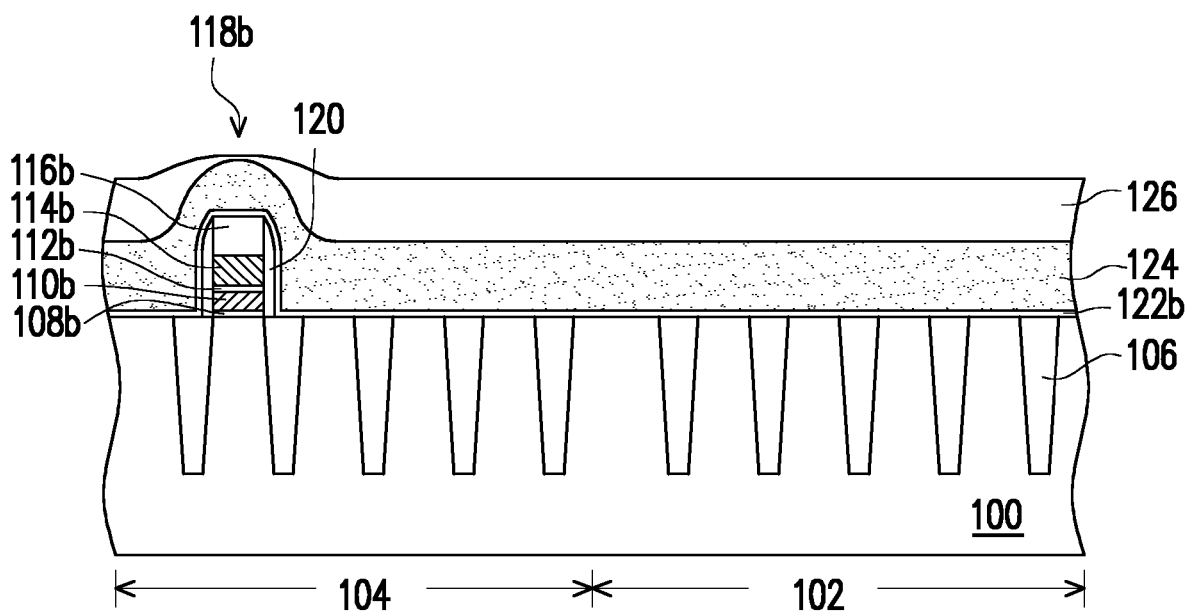
Figure 3E:
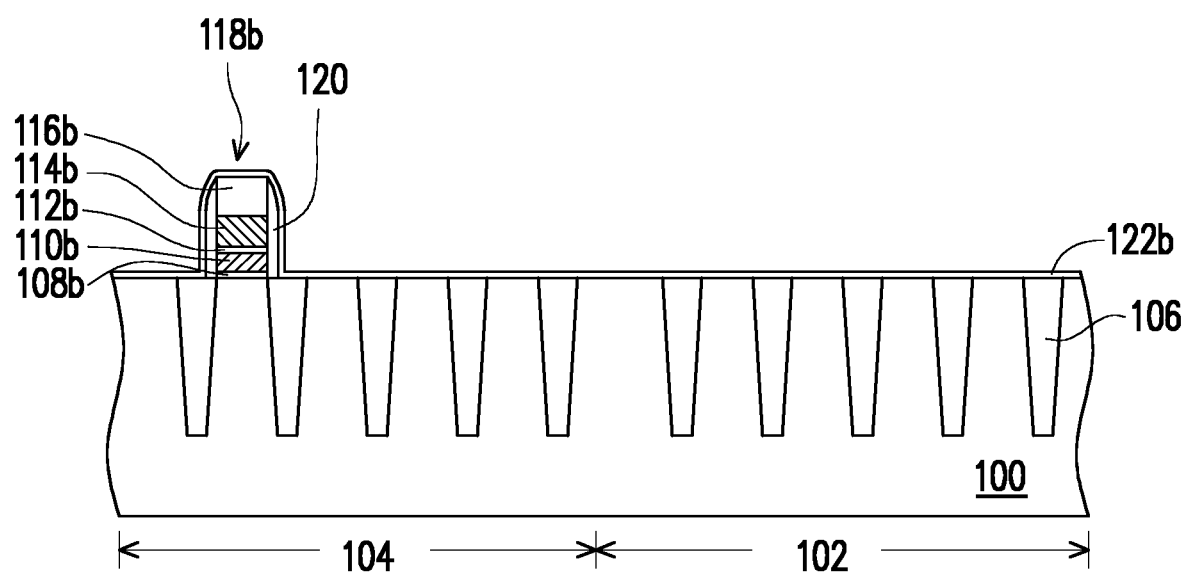
Figure 4A:
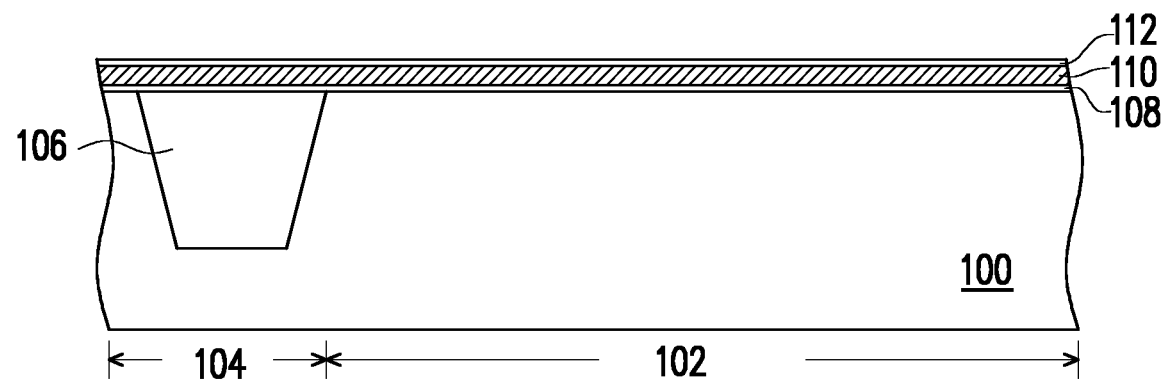
FIGS. 4A-4E are cross-sectional views showing the non-volatile memory taken along the line B-B' of FIG. 2 at various stages of the manufacturing method according to some embodiments of the present disclosure.
Figure 4B:
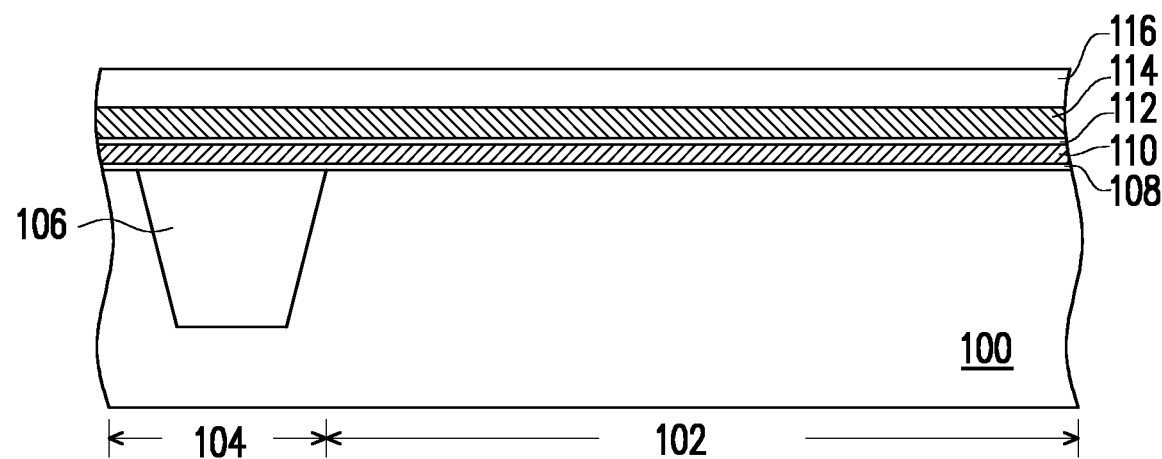
Figure 4C:
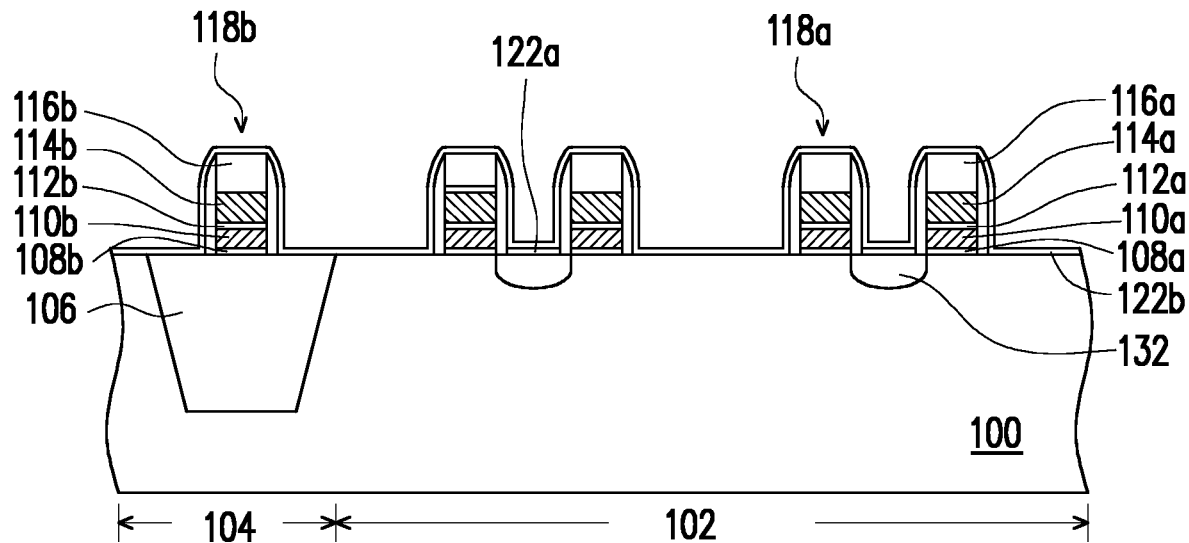
Figure 4D:
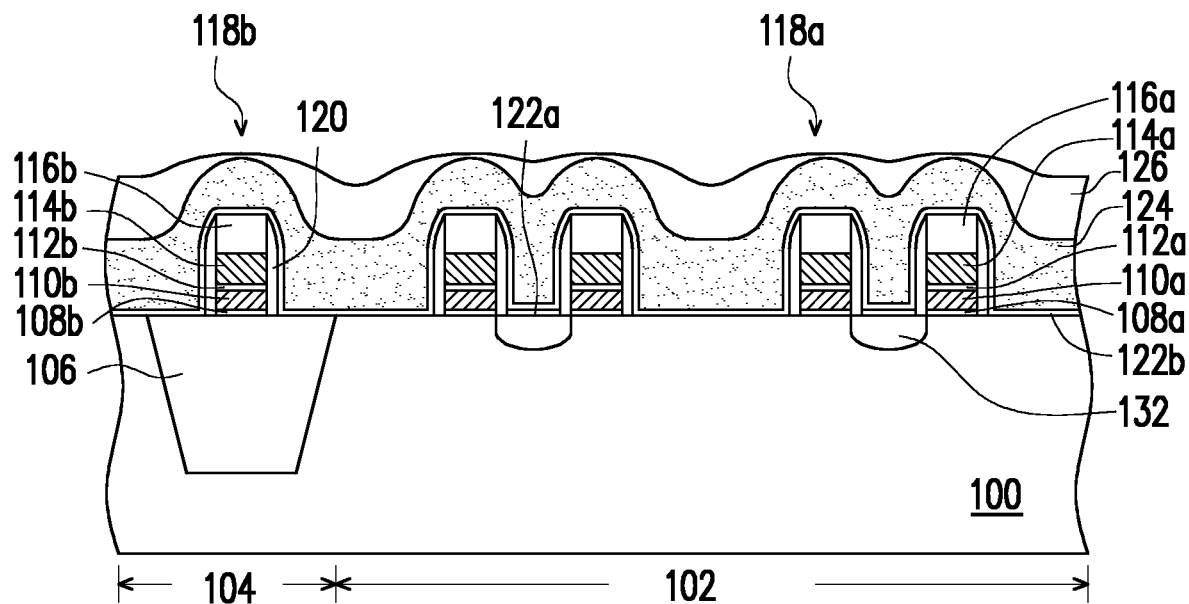
Figure 4E:
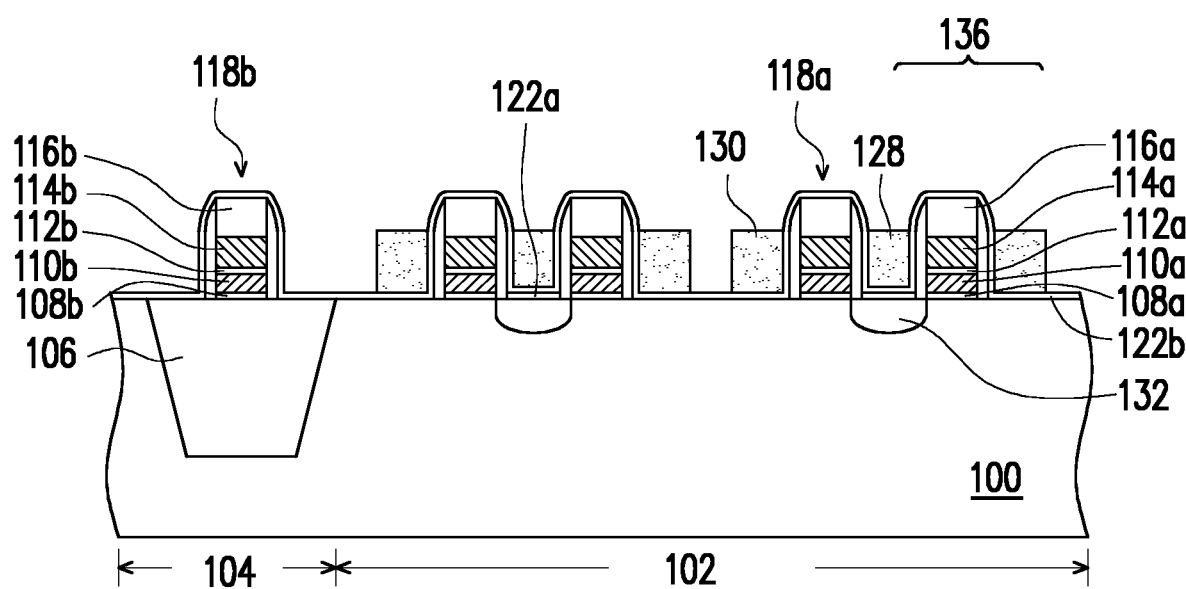
Figure 5A:
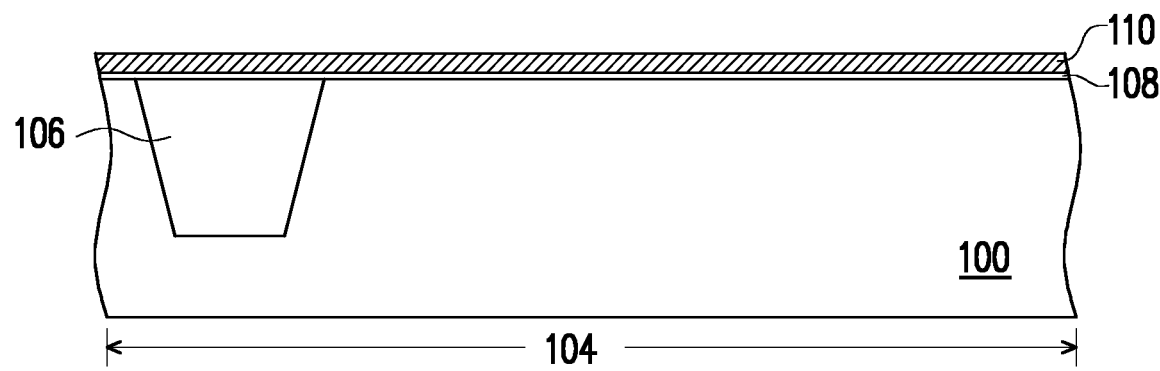
FIGS. 5A-5E are cross-sectional views showing the non-volatile memory taken along the line C-C' of FIG. 2 at various stages of the manufacturing method according to some embodiments of the present disclosure.
Figure 5B:
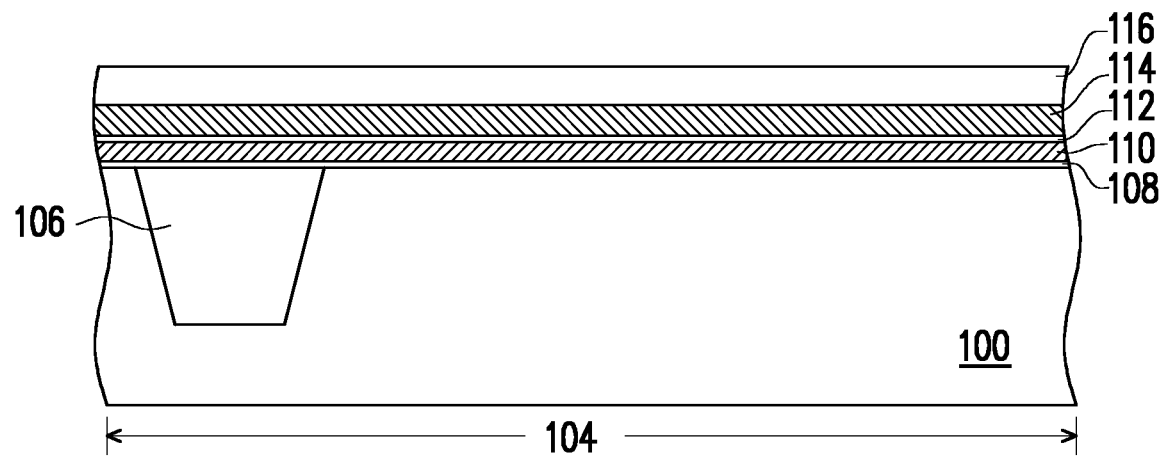
Figure 5C:
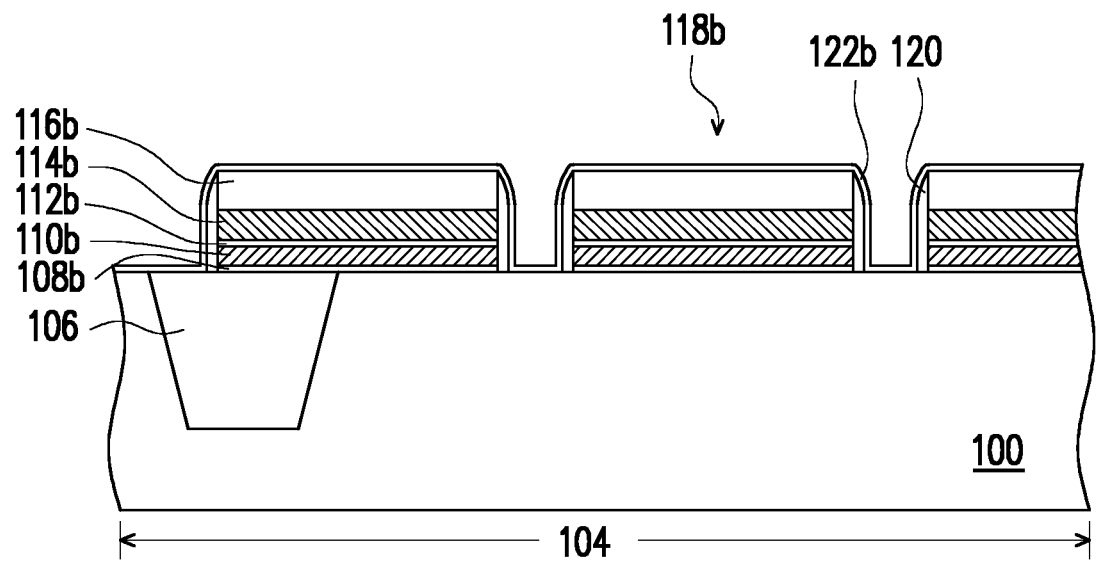
Figure 5D:
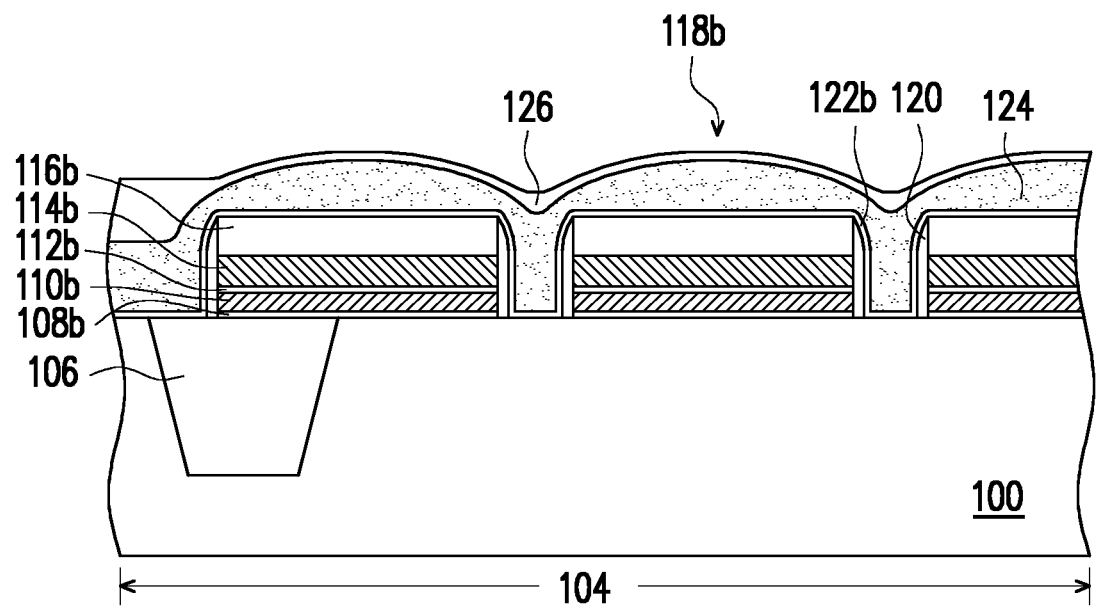
Figure 5E:
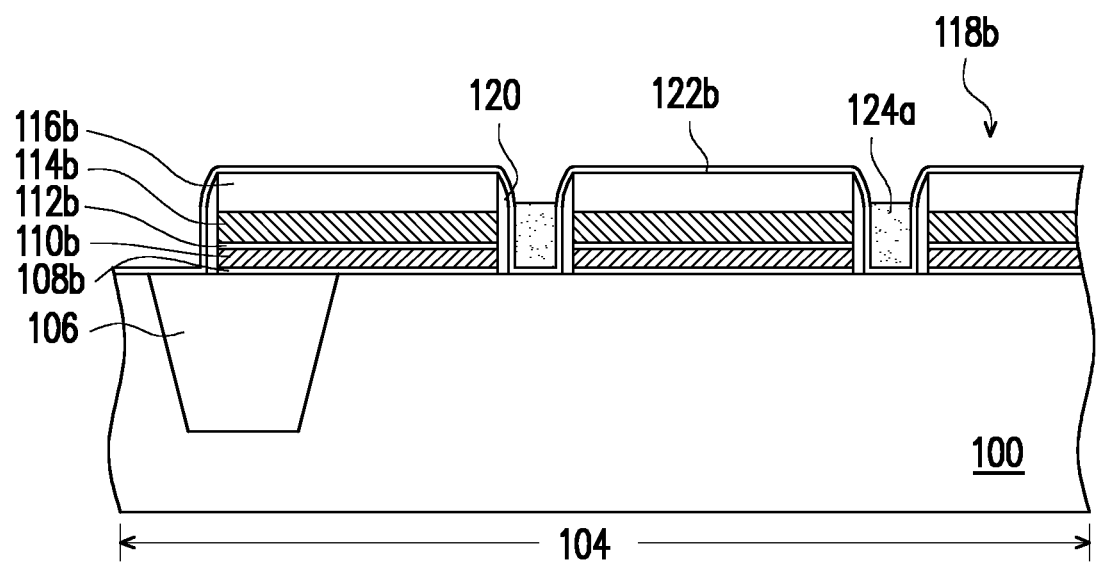

In accordance with the embodiments, FIG. 1 is an exemplary flow chart showing the process steps of the method for manufacturing a non-volatile memory. The various process steps of the process flow illustrated in FIG. 1 may include multiple process steps as discussed below. FIG. 2 is a top view showing the non-volatile memory according to some embodiments of the present disclosure. FIGS. 3A-3E are cross-sectional views showing the non-volatile memory taken along the line A-A' of FIG. 2 at various stages of the manufacturing method according to some embodiments of the present disclosure. FIGS. 4A-4E are cross-sectional views showing the non-volatile memory taken along the line B-B' of FIG. 2 at various stages of the manufacturing method according to some embodiments of the present disclosure. FIGS. 5A-5E are cross-sectional views showing the non-volatile memory taken along the line C-C' of FIG. 2 at various stages of the manufacturing method according to some embodiments of the present disclosure.

As shown in FIGS. 1, 2, 3A, 4A and 5A, a substrate 100 is provided. The substrate 100 includes a first region 102 and a second region 104 which is located at periphery of the first region 102 (Step S100). In some embodiments, the substrate 100 is a bulk silicon substrate. Depending on the requirements of design, the substrate 100 may be a P-type substrate or an N-type substrate and include different doped regions.

In some embodiments, the first region 102 is a memory cell array region, for example. The second region 104 is a peripheral circuit region or a dummy pattern region, for example.

Then, a plurality of device isolation structures 106 are formed to define a plurality of active areas (Step S102). A first dielectric layer 108 is formed over the substrate 100, and a first conductive layer 110 is formed over the first dielectric layer 108 (Step S104). In some embodiments, the device isolation structures 106 can be shallow trench isolation (STI) structures. In some embodiments, the device isolation structures 106 are formed by the following steps: forming a mask layer (not shown) over the substrate 100; patterning the mask layer to form openings (not shown) which expose the substrate 100; etching the substrate 100 to form a plurality of trenches (not shown) by using the mask layer as a mask and filling an insulation material in the trenches. In some embodiments, the insulation material filled in the trenches is silicon oxide, for example. In some embodiments, a material of the first dielectric layer 108 is silicon oxide, for example. A method of forming the first dielectric layer 108 includes performing a thermal oxidation process. In some embodiments, a material of the first conductive layer 110 is doped polysilicon, for example. A method of forming the first conductive layer 110 includes performing an ion implantation process after one undoped polysilicon layer (not shown) is formed by a chemical vapor deposition (CVD) process, or the first conductive layer 110 can be formed by adopting an in-situ implanting operation in the CVD process. In some embodiments, a first dielectric layer 108 and a first conductive layer 110 are sequentially formed over the substrate 100, and then a plurality of device isolation structures 106 are formed in the first conductive layer 110, the first dielectric layer 108 and the substrate 100 to define active areas, and the device isolation structures 106 are etched back so that the top surface of the device isolation structures 106 is lower than the top surface of the first conductive layer 110.

As shown in FIGS. 1, 2, 3B, 4B and 5B, a second dielectric layer 112 is formed over the first conductive layer 110, a second conductive layer 114 is formed over the second dielectric layer 112, and a cap layer 116 is formed over the second conductive layer 114 (Step S106). In some embodiments, a material of the second dielectric layer 112 is silicon oxide/silicon nitride/silicon oxide, and a method of forming the same includes forming a silicon oxide layer, a silicon nitride layer and a silicon oxide layer in sequence by using a CVD process or a thermal oxidation process. In some embodiments, a material of the second dielectric layer 112 can also be silicon oxide, silicon nitride or silicon oxide/silicon nitride or the similar materials, and a method of forming the same can include performing a CVD process by using different reaction gases depending on the material thereof. In some embodiments, a material of the second conductive layer 114 is metal, silicide or doped polysilicon, for example. In some embodiments, a method of forming the second conductive layer 114 includes performing an ion implantation process after one undoped polysilicon layer (not shown) is formed by a chemical vapor deposition (CVD) process, or the second conductive layer 114 can be formed by adopting the in-situ implanting operation in the CVD process. In some embodiments, a material of the cap layer 116 is silicon nitride, silicon oxide or a combination thereof, for example. The cap layer 116 is formed by, for example, a chemical vapor deposition (CVD) process. The cap layer 116 can be a single layer or include multiple layers, for example.

As shown in FIGS. 1, 2, 3C, 4C and 5C, a plurality of stacked structures 118a are formed on the first region 102 of the substrate 100, and wall structures 118b are formed on the second region 104 of the substrate 100 (Step S108). In some embodiments, the cap layer 116, the second conductive layer 114, the second dielectric layer 112, the first conductive layer 110 and the first dielectric layer 108 are patterned to form the stacked structures 118a on the first region 102 of the substrate 100 and the wall structures 118b on the second region 104 of the substrate 100 by using a patterned mask layer (not shown) as the mask, and then the patterned mask layer is removed. In some embodiments, a material of the patterned mask layer can be photoresist. A method of forming the patterned mask layer includes the following steps: forming a photoresist material layer over the substrate 100 and performing an exposure process and a development process on the photoresist material layer to form the patterned mask layer. In some embodiments, the wall structures 118b have a thickness equal to or larger than the stacked structures 118a.

The stacked structures 118a include the cap layer 116a, the second conductive layer 114a, the second dielectric layer 112a, the first conductive layer 110a and the first dielectric layer 108a. In some embodiments, the first dielectric layer 108a serves as a tunneling dielectric layer, the first conductive layer 110a serves as a floating gate, the second dielectric layer 112a serves as an inter-gate dielectric layer, and the second conductive layer 114a serves as a control gate. The wall structures 118b include the cap layer 116b, the second conductive layer 114b, the second dielectric layer 112b, the first conductive layer 110b and the first dielectric layer 108b. The number of the stacked structures 118a shown here is for illustrative purposes and is not intended to limit the structure of the present disclosure.

In some embodiments, spacers 120 are formed over the sidewall of the stacked structure 118a and the sidewall of the wall structures 118b. In some embodiments, the spacers 120 are formed of dielectric materials, such as silicon oxide, silicon nitride or a combination thereof. In some embodiments, the spacers 120 are formed by depositing a blanket layer of a dielectric material by chemical vapor deposition (CVD) and performing an anisotropic etching process to form the spacers 120 on both sides of the stacked structure 118a and the wall structures 118b.

After that, a doping region 132, a third dielectric layer 122a and a fourth dielectric layer 122b are formed (Step S110). In some embodiments, the doping region 132 is formed in the substrate 100 between two stacked structures 118a. In some embodiments, a method of forming the doping region 132 includes forming a patterned mask layer (not shown), performing a dopant implantation process with use of the patterned mask layer as the mask, and removing the patterned mask layer. In some embodiments, a material of the patterned mask layer can be photoresist. A method of forming the patterned mask layer includes the following steps: forming a photoresist material layer over the substrate 100 and performing an exposure process and a development process on the photoresist material layer to form the patterned mask layer. In some embodiments, the doping region 132 serves as a common source region.

In some embodiments, the third dielectric layer 122a is formed over the doping region 132. A material of the third dielectric layer 122a is silicon oxide, for example. A method of forming the third dielectric layer 122a includes performing a thermal oxidation process. In some embodiments, the fourth dielectric layer 122b is formed over the substrate 100. A material of the fourth dielectric layer 122b is silicon oxide, for example. A method of forming the fourth dielectric layer 122b includes performing a chemical vapor deposition (CVD) process.

As shown in FIGS. 1, 2, 3D, 4D and 5D, a third conductive layer 124 is formed over the substrate, and a bottom anti-reflective coating (BARC) 126 is formed over the third conductive layer (Step S112). In some embodiments, a material of the third conductive layer 124 is metal, silicide or doped polysilicon, for example. In some embodiments, a method of forming the third conductive layer 124 includes performing an ion implantation process after one undoped polysilicon layer (not shown) is formed by a chemical vapor deposition (CVD) process, or the third conductive layer 124 can be formed by adopting the in-situ implanting operation in the CVD process.

In some embodiments, the bottom anti-reflective coating 126 is formed by spin-coating and may include an organic material. In addition, the bottom anti-reflective coating 126 can include a material having heightened gap-filling characteristics so as to efficiently fill the recess of the third conductive layer 124. The wall structures 118b are used as retaining walls to prevent re-flow of the bottom anti-reflective coating 126, such that the bottom anti-reflective coating 126 has a uniform thickness in center of the second region 102 (memory cell array) and the edge of the second region 102 (memory cell array).

As shown in FIGS. 1, 2, 3E, 4E and 5E, the bottom anti-reflective coating 126 and the third conductive layer 124 are etched back (Step S114). In some embodiments, the bottom anti-reflective coating 126 and the third conductive layer 124 are removed by reactive ion etching (RIE). In some embodiments, the third conductive layer 124 is removed until its top surface is lower than the top surfaces of the cap layer 114a and the cap layer 114b. The etched back third conductive layer 124 has a uniform thickness in center of the second region 102 (memory cell array) and the edge of the second region 102 (memory cell array), for the bottom anti-reflective coating 126 has a uniform thickness in center of the second region 102 (memory cell array center) and the edge of the second region 102 (memory cell array edge).

Then, the third conductive layer 124 is patterned (Step S116). In some embodiments, the third conductive layer 124 is patterned to separate the cells 136. In some embodiments, the third conductive layer 124 is patterned by using a patterned mask layer (not shown) as the mask, and then the patterned mask layer is removed. In some embodiments, a material of the patterned mask layer can be photoresist. A method of forming the patterned mask layer includes the following steps: forming a photoresist material layer over the substrate 100 and performing an exposure process and a development process on the photoresist material layer to form the patterned mask layer. In some embodiments, the etched back third conductive layer 124 between two stacked structures 118a serves as an erase gate 128. In some embodiments, the patterned third conductive layer 124 serves as a word line 130. In some embodiments, the third conductive layer 124a remains between the wall structures 108b.

The etched back third conductive layer 124 has a uniform thickness in center of the second region 102 and the edge of the second region 102, such that the active area recess and bridge of neighbor cells can be avoided. Further, the third conductive layer 124 in the edge of the second region 102 has a thickness to protect Si surface (active area) during the etch process of the third conductive layer 124 and avoid Si (active area) damage.

In the above embodiments, a plurality of stacked structures 118a on the first region 102 of the substrate 100 and the wall structures 118b on the second region 104 of the substrate 100 are formed in the same processes, such that no extra mask is needed to create retaining walls (wall structures 118b) and no extra process is needed.

Figure 6:
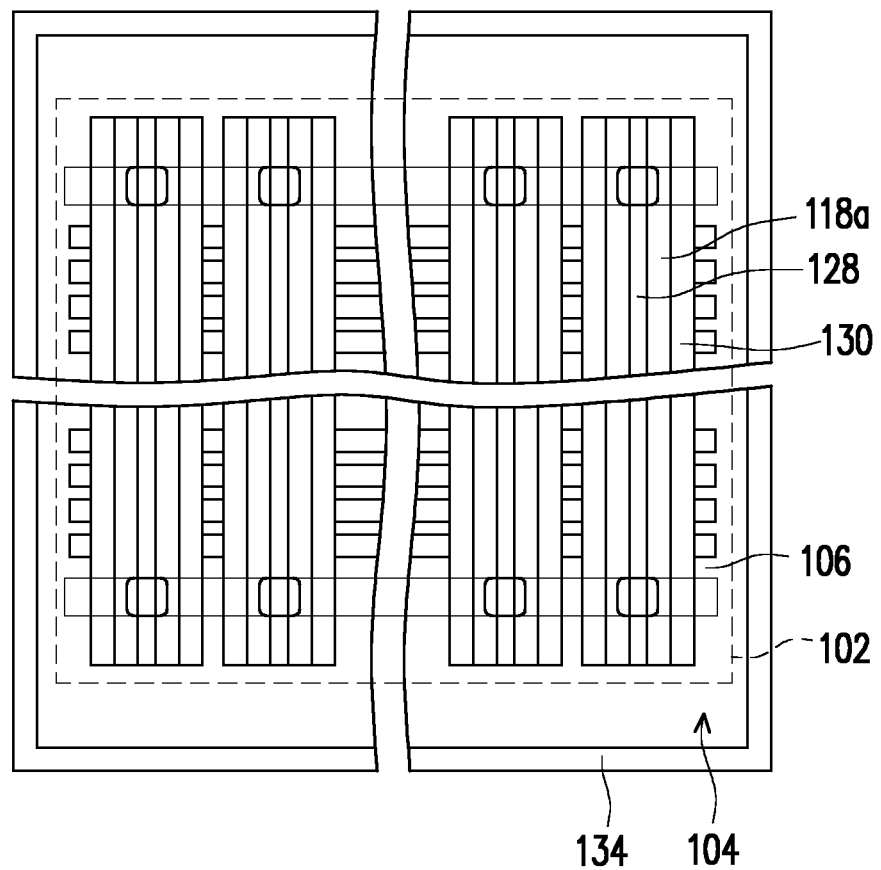
FIG. 6 is a top view showing the non-volatile memory according to some embodiments of the present disclosure.

In some embodiments, as shown in FIG. 6, the wall structure 134 is continuously formed on periphery of the first region 102. The stacked structures 118a at the first region 102 of the substrate 100 and the wall structure 134 on the second region 104 of the substrate 100 are formed in the same processes, such that no extra mask is needed to create retaining walls (wall structures 118b) and no extra process is needed. In some embodiments, the stacked structures 118a on the first region 102 of the substrate 100 and the wall structure 134 on the second region 104 of the substrate 100 are formed in different processes. In some embodiments, a thickness of the wall structure 134 is equal to or larger than the thickness of the stacked structures 118a.

As shown in FIGS. 2, 3E, 4E and 5E, a non-volatile memory includes a plurality of memory cells 136 and wall structures 118b. In some embodiments, the plurality of memory cells 136 are located on a first region 102 of a substrate 100; and the wall structures 118b are located on a second region 104 of the substrate 100, wherein the second region 104 is located at periphery of the first region 102. In some embodiments, the first region 102 is, for example, a memory cell array region; and the second region 104 is, for example, a peripheral circuit region or a dummy pattern region. In some embodiments, the non-volatile memory includes device isolation structures 106 located in the substrate 100 to define active areas, for example. The device isolation structures 106 can be shallow trench isolation structures.

The memory cell includes a stacked structure 118a, a doped region 132, an erase gate 128, and a word line 130. In some embodiments, the stacked structure 118a includes the cap layer 116a, the second conductive layer 114a (control gate), the second dielectric layer 112a (inter-gate dielectric layer), the first conductive layer 110a (floating gate) and the first dielectric layer 108a (tunneling dielectric layer). The second conductive layer 114a (control gate) is located over the substrate 100, and the second conductive layer 114a (control gate) is made of doped polysilicon, for example. The first conductive layer 110a (floating gate) is located between the second conductive layer 114a (control gate) and the substrate 100, and the first conductive layer 110a (floating gate) is made of doped polysilicon, for example. The second dielectric layer 112a (inter-gate dielectric layer) is located between the second conductive layer 114a (control gate) and the first conductive layer 110a (floating gate), and the second dielectric layer 112a (inter-gate dielectric layer) is made of silicon oxide/silicon nitride/silicon oxide, silicon oxide, silicon nitride or silicon oxide/silicon nitride or similar materials. The first dielectric layer 108a (tunneling dielectric layer) is located between the first conductive layer 110a (floating gate) and the substrate, and first dielectric layer 108a (tunneling dielectric layer) is made of silicon oxide, for example. The cap layer 116a is located over the second conductive layer 114a (control gate), and the cap layer 116a is made of silicon nitride, silicon oxide or a combination thereof, for example.

The doped region 132 is located in the substrate 100 at a first side of the stacked structure 118a. The doped region 132 is a P-type or N-type doped region depending on whether the memory cell is a P-type memory cell or an N-type memory cell. The erase gate is located on the sidewall of the first side of the stacked structure 118a and located over the substrate 100 between the stacked structure 118a and the doped region 132, and the erase gate is made of doped polysilicon, for example. In some embodiments, the non-volatile memory includes a third dielectric layer 122a that is formed over the doping region 132. The word line 130 is located on the sidewall of a second side of the stacked structure 118a, and the word line 130 is made of doped polysilicon, for example. In some embodiments, the non-volatile memory includes a fourth dielectric layer 122b formed over the substrate 100 and between the substrate 100 and the word line 130. The fourth dielectric layer 122a is made of silicon oxide, for example.

In some embodiments, the non-volatile memory includes the third dielectric layer 122a that is formed over the doping region 132. The third dielectric layer 122a is made of silicon oxide, for example.

In some embodiments, the wall structure 118b includes the cap layer 116b, the second conductive layer 114b, the second dielectric layer 112b, the first conductive layer 110b and the first dielectric layer 108b, for example.

The second conductive layer 114b is located over the substrate 100, and the second conductive layer 114b is made of doped polysilicon, for example. The first conductive layer 110b is located between the second conductive layer 114b and the substrate 100, and the first conductive layer 110b is made of doped polysilicon, for example. The second dielectric layer 112b is located between the second conductive layer 114b and the first conductive layer 110b, and the second dielectric layer 112b is made of silicon oxide/silicon nitride/silicon oxide, silicon oxide, silicon nitride or silicon oxide/silicon nitride or similar materials. The first dielectric layer 108b is located between the first conductive layer 110b and the substrate, and first dielectric layer 108b is made of silicon oxide. The cap layer 116b is located over the second conductive layer 114b, and the cap layer 116b is made of silicon nitride, silicon oxide or a combination thereof, for example. In some embodiments, a third conductive layer 124a is located between the wall structures 118b, and the third conductive layer 124a is made of doped polysilicon, for example.

In the above embodiments, the non-volatile memory includes a plurality of stacked structures 118a on the first region 102 of the substrate 100 and the wall structures 118b on the second region 104 of the substrate 100. The wall structures 118b are used as retaining walls to prevent re-flow of bottom anti-reflective coating during the formation of the erase gate and word line, such that the bottom anti-reflective coating has a uniform thickness in center of the second region 102 (memory cell array) and the edge of the second region 102 (memory cell array). The etched back third conductive layer 124 has a uniform thickness in center of the second region 102 and the edge of the second region 102, such that the active area recess and bridge of neighbor cells can be avoided. Further, the third conductive layer 124 in the edge of the second region 102 has a thickness to protect Si surface (active area) during the etch process of the third conductive layer 124 and avoid Si (active area) damage.

In some embodiments of the present disclosure, a semiconductor device includes a substrate, a stacked gate structure, and a wall structure. The stacked gate structure is on the substrate and extending along a first direction. The wall structure is on the substrate and laterally aside the stacked gate structure. The wall structure extends along the first direction and a second direction perpendicular to the first direction. The stacked gate structure is overlapped with the wall structure in the first direction and the second direction.

In some embodiments of the present disclosure, a semiconductor device includes a substrate, a stacked gate structure, and a wall structure. The stacked gate structure is on the substrate and includes a first sidewall and a second sidewall perpendicular to the first sidewall. The wall structure is on the substrate and laterally surrounding the stacked gate structure. The first sidewall of the stacked gate structure faces a first inner sidewall of the wall structure, and the second sidewall of the gate structure faces a second inner sidewall of the wall structure.

In some embodiments of the present disclosure, a semiconductor device includes a substrate, a memory cell and a wall structure. The substrate includes a memory region and a periphery region. The memory cell is disposed on the memory region of the substrate. The wall structure is disposed on the periphery region of the substrate. The memory cell includes four lateral sides, and the four lateral sides of the memory cell are laterally surrounded by the wall structure.

In some embodiments of the present disclosure, a semiconductor device includes a stacked gate structure, a plurality of stacks and a first conductive layer. The stacks are disposed aside the stacked gate structure and arranged along both a first direction and a second direction perpendicular to the first direction, wherein the stacks are extended continuously along the first direction and segmented in the second direction. The first conductive layer is disposed between segmented portions of the stacks along the second direction, wherein top surfaces of the segmented portions of the stacks are higher than a top surface of the first conductive layer.

In some embodiments of the present disclosure, a semiconductor device includes a stacked gate structure, a wall structure, a first conductive layer and a first dielectric layer. The wall structure is disposed aside the stacked gate structure and includes a plurality of stacks arranged along both a first direction and a second direction perpendicular to the first direction, wherein the stacks are extended continuously along the first direction and segmented in the second direction. The first conductive layer is disposed between segmented portions of the stacks of the wall structure along the second direction. The first dielectric layer is continuously disposed on top surfaces of the segmented portions of the stacks and under a bottom surface of the first conductive layer.

In some embodiments of the present disclosure, a manufacturing method of a semiconductor device includes the following steps. A substrate is provided. A multilayer over the substrate is formed. The multilayer is patterned, to form a plurality of stacks and a stacked gate structure, the stacks arranged along both a first direction and a second direction perpendicular to the first direction, wherein the stacks are extended continuously along the first direction and segmented in the second direction. A first conductive layer is formed between segmented portions of the stacks along the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a plurality of stacks and a stacked gate structure over a substrate, wherein the stacks are arranged along both a first direction and a second direction perpendicular to the first direction, and the stacks are extended continuously along the first direction and segmented in the second direction; and
   a first conductive layer over the substrate, extending along the first direction and between segmented portions of the stacks along the second direction.

2. The semiconductor device of claim 1, wherein the stacks are arranged to form a non-continuous ring to surround the stacked gate structure.

3. The semiconductor device of claim 1, wherein a top surface of the first conductive layer is lower than top surfaces of the stacks.

4. The semiconductor device of claim 1, wherein the stacked gate structure and the stacks respectively comprise a second conductive layer, a dielectric layer and a third conductive layer stacked sequentially on the second conductive layer.

5. The semiconductor device of claim 4, wherein surfaces of the second conductive layer, the dielectric layer and the third conductive layer of the stacked gate structure are substantially coplanar with surfaces of the second conductive layer, the dielectric layer and the third conductive layer of the stacks, respectively.

6. The semiconductor device of claim 4, wherein the stacked gate structure and the stacks respectively comprise a pair of spacers disposed at sidewalls of the second conductive layer.

7. The semiconductor device of claim 6, further comprising a first dielectric layer disposed between the pair of spacers of the stacks and the first conductive layer.

8. The semiconductor device of claim 7, wherein the first dielectric layer is further disposed between the first conductive layer and the substrate.

9. A semiconductor device, comprising:
   a stacked gate structure;
   a plurality of stacks aside the stacked gate structure and arranged along both a first direction and a second direction perpendicular to the first direction, wherein the stacks are extended continuously along the first direction and segmented in the second direction; and
   a first conductive layer between segmented portions of the stacks along the second direction, wherein top surfaces of the segmented portions of the stacks are higher than a top surface of the first conductive layer.

10. The semiconductor device of claim 9, wherein the stacks are arranged to form a non-continuous ring.

11. The semiconductor device of claim 9, wherein the stacks respectively comprise a second conductive layer, a dielectric layer and a cap layer.

12. The semiconductor device of claim 9, wherein the stacks respectively comprise a second conductive layer and a pair of spacers disposed at sidewalls of the second conductive layer.

13. The semiconductor device of claim 9, wherein the stacks surround the stacked gate structure.

14. The semiconductor device of claim 9, further comprising:
   an erase gate laterally aside a first side of the stacked gate structure; and
   a word line laterally aside a second side of the stacked gate structure.

15. The semiconductor device of claim 14, wherein a material of the first conductive layer is the same as materials of the erase gate and the word line.

16. The semiconductor device of claim 14, wherein the top surface of the first conductive layer is substantially coplanar with top surfaces of the erase gate and the word line.

17. A semiconductor device, comprising:
   a stacked gate structure;
   a wall structure aside the stacked gate structure, comprising a plurality of stacks arranged along both a first direction and a second direction perpendicular to the first direction, wherein the stacks are extended continuously along the first direction and segmented in the second direction;
   a first conductive layer between segmented portions of the stacks of the wall structure along the second direction; and
   a first dielectric layer, wherein the first dielectric layer is continuously disposed on top surfaces of the segmented portions of the stacks and under a bottom surface of the first conductive layer.

18. The semiconductor device of claim 17, wherein the wall structure surrounds the stacked gate structure.

19. The semiconductor device of claim 17, wherein the top surfaces of the segmented portions of the stacks of the wall structure are higher than a top surface of the first conductive layer.

20. The semiconductor device of claim 17, wherein one of the segmented portions of the stacks of the wall structure comprises a second conductive layer, a second dielectric layer, a third conductive layer and a cap layer stacked sequentially on the second conductive layer.

* * * * *